United States Patent [19]
Maier et al.

[11] Patent Number: 5,413,980
[45] Date of Patent: May 9, 1995

[54] HIGH-T SUPERCONDUCTOR AND PROCESS FOR PREPARING IT

[75] Inventors: Joachim Maier, Wiernsheim; Albrecht Rabenau, deceased, late of Stuttgart, by Marie-Luise J. O. Rabenau, néDamm, Thomas Rabenau, legal heirs; Pandijan Murugaraj, Stuttgart, all of Germany

[73] Assignee: Hoechst Aktiengesellschaft, Frankfurt am Main, Germany

[21] Appl. No.: 573,038

[22] PCT Filed: Feb. 22, 1989

[86] PCT No.: PCT/EP89/00163

§ 371 Date: Oct. 9, 1991

§ 102(e) Date: Oct. 9, 1991

[87] PCT Pub. No.: WO89/08330

PCT Pub. Date: Sep. 8, 1989

[30] Foreign Application Priority Data

Feb. 25, 1988 [DE] Germany .................. 38 05 954.1

[51] Int. Cl.⁶ .................. H01B 12/00; H01L 39/12
[52] U.S. Cl. .................. 505/121; 505/725; 505/775; 505/780; 505/785; 505/125; 505/500; 505/501; 252/518
[58] Field of Search .................. 505/1, 775, 780, 785, 505/725; 252/518

[56] References Cited

U.S. PATENT DOCUMENTS

| | | | |
|---|---|---|---|
| 4,839,339 | 6/1989 | Bunker et al. | 505/1 |
| 4,942,151 | 7/1990 | Capone et al. | 505/1 |
| 4,973,575 | 11/1990 | Capone | 505/1 |

OTHER PUBLICATIONS

Ishizawa et al "Superconducting Properties of Highly Oxidized Superconductor . . . " *Jap. Journ. of App Physics*, vol. 26, No. 5, pp. L676–677 May 1987.

Avsloos et al, "Effects of Alkali Cation (Li, Na, K, Cs) Substitution on the . . . ", *Solid State Comm.* vol. 68, No. 6, pp. 539–545, 1988.

Inoue et al, "Element Addition Effect for Superconducting Properties of YBa₂Cu₃O₇₋ᵧ Ceramics", *Nipp. Ser.* vol. 96, No. 4, pp. 512–516, 1985.

Frank et al, "Superconductivity in Systems of Composition", *Rev. of Sol. State Science* vol. 1, No. 2, pp. 405–410, 1987.

Phys. Rev. Lett., Band 58, Nr. 9. März 1987 M. K. Wu et al., 908–910.

Jap. J. Appl. Phys., Pf 2 letters, vol. 26 Nr. 5, Mai 1987 Hideka et al., L. 726–728.

Science, vol. 239, Feb. 26, 1988, M. A. Subramanian, 1015–1017.

4, Saito et al. Physica, 148B (1987) S. 336–338.

Yuhuan Xu et al., phys. stet. sol. (a) 103 (1987), S. 113–117.

P. Ganguly et al., Solid State Com. vol. 62, No. 17. 1987 S. 807–809.

Primary Examiner—Paul Lieberman
Assistant Examiner—M. Kopec
Attorney, Agent, or Firm—Curtis, Morris & Safford

[57] ABSTRACT

Polycrystalline high-$T_c$ superconductors of the formula $M_mE_eRO_x$, which contain grains which are crystallographically aligned to the greatest possible extent, where M is at least one trivalent element such as a lanthanide element, E is at least one divalent element such as an alkaline earth element and R is at least one transition metal such as Cu, and x denotes the proportion of oxygen, are obtained by substituting a part of the alkaline earth element by a foreign element, preferably an alkali-metal element, which is no longer present in the product after the reaction sintering and sintering except for contents in the ppm to parts per thousand range and brings about the orientation effect. This produces a material which contains a slight deficit of E and optionally M, has an unaltered critical temperature and is substantially more resistant to external agents than equivalent known materials. A post-treatment in a stream of air or oxygen is unnecessary. Single crystals having relatively large dimensions can also be produced in a corresponding manner.

8 Claims, No Drawings

HIGH-T SUPERCONDUCTOR AND PROCESS FOR PREPARING IT

The present invention relates to a high-$T_c$ superconductor, in particular a ceramic superconductor of a type which contains at least one trivalent element, at least one divalent element, at least one further element, in particular a transition metal element such as copper or niobium, and oxygen. Typical representatives of such ceramic high-$T_c$ superconductors are represented, for example, by the formulae $ME_{2-y}R_2O_x$, $ME_{2-y}R_3O_x$ and $M_2E_{3-y}O_x$, where M is at least one trivalent element such as a lanthanide element, bismuth, or yttrium, E is at least one divalent element such as an alkaline earth element, and R is at least one transition element, and x specifies the proportion of oxygen.

The transition element component R is preferably composed entirely or at least partly of copper. In the compound named as second above, it is preferable that $6{,}2 < x < 7.2$.

The invention further relates to a process for preparing ceramic high-$T_c$ superconducting materials. It is particularly suitable for preparing high-$T_c$ superconductors of the above type but can be applied quite generally, that is to say, for example, also to the La-Sr-Nb-O system.

The term "high-$T_c$ superconductor" should in this case be understood to mean superconducting materials whose critical temperature $T_c$ is above 30K.

It is known that the ceramic high-$T_c$ superconductors of the abovementioned types have a strongly anisotropic crystal structure and their superconducting properties, such as the critical current density and the critical field strength, are strongly directionally dependent with reference to the crystal structure. Efforts are therefore made to prepare single crystals which are as large as possible from the materials mentioned. However, according to the present prior art, fairly large volumes of these ceramic superconducting materials can economically be prepared only in polycrystalline form and the individual crystallites or grains of the polycrystalline material have then to be crystallographically similarly aligned if the optimum superconducting properties are to be exploited.

A publication by Wu and Ruckenstein in MATERIALS LETTERS, Volume 5, No. 11.12, October 1987, pages 432–435 discloses that the critical current density and the critical field strength of $YBa_2Cu_3O_7$ is particularly high in the direction of the |001| planes, i.e. of the Cu-O planes and that these planes can be aligned in polycrystalline material by pressing and subsequent sintering perpendicularly to the pressing direction.

A publication by Omori et al., JAPANESE JOURNAL OF APPLIED PHYSICS, Volume 26, No. 8, August 1987, pages L1421–L1422–L1423 discloses the preparation of oriented orthorhombic $YBa_2Cu_3O_{7-x}$ polycrystals from tetragonal platelet-type crystals by grinding, pressing and sintering in an oxygen atmosphere.

A publication in Science-Vol. 238 (1987), pages 1655–1656 discloses that oriented grains of an yttrium-barium-copper oxide superconductor can be prepared by fusion at 1,300° C., controlled cooling and subsequent heat treatment for the purpose of oxidizing. This made it possible to increase the critical current density by several powers of ten.

Accounts of Chemical Research, 21, No. 1, pages 1 to 7 discloses the doping of the Ba sites of a YBCO superconductor with alkali-metal ions (K, Rb, Cs), with $YBa_2Cu_3O_{7-y}$ being obtained. Replacing the Cu by Ni or Co reduced the critical temperature $T_c$ considerably.

High-$T_c$ superconductors having the formula $LaBa_2Cu_3O_{7-x}$ and $RBa_2Cu_3O_{7-x}$ (orthorhombic; R=Y, Sin, Eu, Gd, Dy, Ho, Tm, Yb, Lu; $O<x<0.2$) are disclosed in Nature, Vol. 329, 17.9. 1987, pages 227–229.

The known processes for preparing structured or oriented polycrystalline ceramic high-$T_c$ superconducting materials are complicated, time-consuming and not always readily reproducible. It has hitherto only been possible to prepare single crystals made of high-$T_c$ superconductors with relatively small dimensions. Accordingly, the object of the present invention is to provide a polycrystalline high-$T_c$ superconducting material containing grains which are crystallographically aligned to the greatest possible extent and/or containing relatively large single crystals, and also a simple and reproducible process for preparing such a superconducting material.

A preferred process for preparing a ceramic high-$T_c$ superconducting material according to the invention, in which process the starting materials yielding the desired superconducting material, for example a compound of at least one trivalent element (typically a lanthanide element, bismuth or yttrium), a compound of at least one divalent element (typically an alkaline earth metal) and a compound of a further element (typically a transition metal such as copper or niobium), in particular oxides of these elements, or compounds which yield oxides on heating, are mixed and sintered, comprises, according to the invention, using a mixture which additionally contains a compound, in particular an inorganic compound, which vanishes to the greatest possible extent from the reaction mixture at the preparation temperature, for example volatilizes, is absorbed by the reaction vessel etc. etc. Preferably, the proportion of the divalent element and optionally also of the trivalent element is reduced, i.e. a reaction mixture is used which contains the divalent element, such as the alkaline earth element, in a substoichiometric amount, preferably 5 to 10%, optionally up to 15% below the stoichiometric amount. The compound of the foreign element which vanishes during heating to the greatest possible extent from the superconducting material produced is, in particular, an inorganic metal compound such as an alkali-metal compound, for example an alkali-metal oxide. The foreign element or the foreign elements may be contained in the reaction mixture in an amount which is in terms of moles about equal to, or greater than, the deficit of the divalent (and optionally of the trivalent) element. The molar amount of the foreign element, that is to say, for example, of the alkali metal, which is introduced in the form of a compound such as the oxide, may amount to up to ten times the molar deficit.

The added material volatilizes to the greatest possible extent during the reaction annealing or sintering which is carried out in air or oxygen at customary temperatures, and only traces of the foreign element in the order of magnitude of ppm to a few parts per thousand, based on the molar proportion of the divalent element in the finished superconducting material, are left (e.g., parts per million to parts per thousand range of foreign elemen). It was not possible to achieve the orientation effect by solely reducing the proportion of di- and/or trivalent element in the starting material mixture. The substitution of a part of the proportion of divalent element (in particular alkaline earth element) by at least one foreign element (in particular alkali-metal element) in the starting material mixture yields the best results. It also appears to be advantageous if the ionic radius of the element of the removable compound is about equal to the ionic radius of the substituted divalent element.

The invention is especially suitable for superconductors having "YBaCu" or "123" structure such as yttrium barium cuprate, a potassium compound such as potassium oxide or potassium carbonate preferably being used as removable or volatilizable compound if the alkaline earth metal is barium. The invention can, however, also be used in the case of ceramic superconducting materials having another structure, for example of the lanthanum strontium cuprate type, bismuth calcium strontium cuprate type, lanthanum strontium niobate type and analogous compounds. If the superconducting material contains alkaline earth elements having smaller ionic radii than Ba, compounds of alkali metals having smaller ionic radii than potassium are preferably used as volatilizable compounds.

The material obtained in the manner described above by reaction annealing is in general still somewhat porous. In order to prepare a compact material having crystallographically aligned grains, the material obtained during the reaction anneal is comminuted, for example in a mortar or a ball mill, then pressed in a mold and subsequently sintered. As a result of this additional pressing and sintering operation, a virtually completely compact material, which is 95% or more oriented, is obtained.

The invention provides some important advantages over the prior art:

Above all, molded bodies containing grains crystallographically aligned to the greatest possible extent perpendicular to the c-axis can be prepared. Within the limits of precision of X-ray spectra, a 100% alignment can be achieved. The process is also suitable for forming thin epitaxial layers of high-$T_c$ superconducting materials on suitable substrates.

The process also makes it possible to prepare relatively large single crystals, it is simple and requires relatively little time, and a post-treatment such as annealing is unnecessary.

A further important advantage of the present superconducting materials is that they are substantially more resistant to external agents such as the atmosphere, moisture and mineral acids, than the known ceramic superconducting materials.

EXAMPLE 1

Preparation of a polycrystalline body containing aligned crystallites 1.733 g of $Y_2O_3$,
6.059 g of $BaCO_3$,
3.6685 g of CuO and
0.1 to 0.5 g of $K_2CO_3$ are mixed in acetone and ground in a mortar. The acetone is then evaporated off and the mixture is heated for three hours at 400° C. in a crucible, then it is again comminuted in the mortar. The mixture is then subjected to a reaction sintering at 950° C. for 10 to 20 hours in an $Al_2O_3$ crucible and then it is cooled to room temperature at a rate of 50° C. per hour. Blocks of centimeter size are obtained which are composed of individual, highly oriented polycrystalline regions having transverse dimensions of about 1 to 3 mm, as detected by X-ray diffraction. The material is superconducting, which was demonstrated by the Meissner effect.

In order to obtain a compact ceramic, the material is again comminuted in a mortar, then pressed and heated in air at 950° C. for 5 to 50 hours, and subsequently cooled.

The material obtained after the first sintering has the formula $$YBa_{1.95}Cu_3O_{6.45+0.2}.$$

Intermediate or subsequent sintering in air (10 to 30 hours at 600° C.) increases the oxygen content slightly.

The compact ceramic prepared in the manner described above is also highly oriented (approximately 95%). Both the material obtained after the first sintering step and also the compact ceramic are substantially more resistant to environmental agents than equivalent known materials. At 94 K, the critical temperature $T_c$ determined by conductivity measurements is the same as that of the equivalent known material $YBa_2Cu_3O_{6.5+x}$; $x>0$.

By repeating the heat treatment at temperatures in the order of magnitude of 600° C., it is possible to obtain larger single crystals having dimensions of approximately 100 $\mu$m and above.

Polycrystalline high-$T_c$ superconductors of the formula $M_mE_eCuO_x$, which contain grains which are crystallographically aligned to the greatest possible extent, where M is at least one trivalent element such as a lanthanide element, E is at least one divalent element such as an alkaline earth element and x is less than or equal to 1.5 m+e+1.5, are obtained by substituting a part of the alkaline earth metal by a foreign element, preferably an alkali-metal element, which is no longer present in the product after reaction sintering and sintering except for foreign contents found in the ppm to parts per thousand range based on the content of divalent (alkaline earth metal) element and brings about the orientation effect. This produces a material which has a slight deficit of E and optionally M, has an unaltered critical temperature and is substantially more resistant to external agents than equivalent known materials. A post-treatment in a stream of oxygen or air is not necessary.

EXAMPLE 2

Preparation of relatively large single crystals 1.733 g of $Y_2O_3$,
6.059 g of $BaCO_3$,
3.6685 g of CuO and
0.5 g of $K_2CO_3$ are mixed and ground as in Example 1. The mixture is heated to 900° C. and then immediately brought to 980° C.–1,000° C. at 20°/h and held there for 24–48 h. The preparation is then slowly cooled (5°–10°/h) to 900° C. and rapidly cooled (50°/h) from that point to room temperature. The product is a solid, compact block composed of large crystals (typically 2×3×1.5mm). As a result of post-oxidation (24–48 h; 600° C.; $O_2$ atmosphere), the tetragonal material becomes orthorhombic. It exhibits (even as an entire block) the Meissner effect in liquid nitrogen and, in addition, also the suspension effect, and has a critical temperature of 90K. Scanning and polarization micrographs show that the crystalline regions harbor microdomains. The individual mosaic domains have only a slight misfit in relation to the orientation.

The chemical analysis shows not only a deficit of Ba, but also an excess of yttrium: $(Y_{0.44}Ba_{0.58})_3Cu_3O_{6.84}$ is a typical composition of two crystals. Interestingly, the Y and Ba content (based on $Cu_1$) add up exactly to 1, which suggests a disorder in the Y-Ba lattice such as can probably occur only at high temperatures.

It is claimed:

1. A ceramic molded body consisting of a high-$T_c$ superconductor of the formula $ME_{2-y}R_2O_x$, $ME_{2-y}R_3O_x$ or $M_2E_{3-y}R_2O_x$, where M is at least one lanthanide element, yttrium, bismuth or combinations thereof, E is at least one alkaline earth metal element, R is copper, x is the proportion of oxygen, and $0.05 < y < 0.3$, wherein crystal grains of the ceramic molded body are aligned approximately 95% perpendicular to the c-axis.

2. A molded body as claimed in claim 1, wherein $y > 0.1$.

3. A molded body as claimed in claim 1, whose composition essentially corresponds to the formula $YBa_{1.95}Cu_3O_{6.45+0.25}$.

4. A process for preparing a ceramic high-$T_c$ superconductor consisting of the formula $ME_{2-y}R_2O_x$, $ME_{2-y}R_3O_x$ or $M_2E_{3-y}R_2O_x$, where M is at least one trivalent element of the lanthanide group, yttrium, bismuth or a combination thereof, E is at least one alkaline earth element, R is copper, x is the proportion of oxygen, and $0 < y < 0.3$, which process comprises preparing a starting mixture which contains the at least one trivalent element of the lanthanide group, yttrium, bismuth or combination thereof, a substoichiometric amount of the at least one alkaline earth element such that there is a molar deficit thereof, the copper and additionally at least one alkali metal compound, lead compound or a combination thereof in an amount equal to or up to 10 times the molar deficit, and annealing the mixture at a preparation temperature of at least about 950° C. wherein the alkali metal compound, lead compound, a combination thereof is removed by the annealing at the preparation temperature.

5. The process as claimed in claim 4, wherein a mixture is used in which the molar proportion of the alkali metal compound, lead compound, or combinations thereof is at least equal to the molar deficit of alkaline earth metal.

6. The process as claimed in claim 4, wherein barium is used as the alkaline earth metal and a compound of potassium is used as the alkali metal compound.

7. The process as claimed in claim 4, wherein the annealed mixture is cooled, comminuted, pressed into a mold and then annealed again.

8. The process as claimed in claim 4 wherein the mixture is annealed in air.

* * * * *